US010594962B2

United States Patent
Kang

(10) Patent No.: US 10,594,962 B2
(45) Date of Patent: Mar. 17, 2020

(54) IMAGE SENSOR, IMAGING DEVICE, MOBILE TERMINAL AND IMAGING METHOD FOR PRODUCING HIGH RESOLUTION IMAGE

(71) Applicant: GUANGDONG OPPO MOBILE TELECOMMUNICATIONS CORP., LTD., Dongguan (CN)

(72) Inventor: Jian Kang, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 15/544,537

(22) PCT Filed: Sep. 22, 2016

(86) PCT No.: PCT/CN2016/099753
§ 371 (c)(1),
(2) Date: Jul. 19, 2017

(87) PCT Pub. No.: WO2017/101546
PCT Pub. Date: Jun. 22, 2017

(65) Prior Publication Data
US 2018/0007289 A1    Jan. 4, 2018

(30) Foreign Application Priority Data
Dec. 18, 2015 (CN) .......................... 2015 1 0963465

(51) Int. Cl.
*H04N 5/357* (2011.01)
*H04N 9/04* (2006.01)
(Continued)

(52) U.S. Cl.
CPC ....... *H04N 5/357* (2013.01); *H01L 27/14621* (2013.01); *H01L 27/14627* (2013.01);
(Continued)

(58) Field of Classification Search
CPC .......... H04N 5/357; H04N 5/378; H04N 9/07; H01L 27/14621; H01L 27/14627; H01L 27/14645

See application file for complete search history.

(56) References Cited

U.S. PATENT DOCUMENTS 8,599,291 B2    12/2013 Min et al.
10,015,417 B2 *  7/2018 Mitsunaga ............. H04N 9/045
(Continued)

FOREIGN PATENT DOCUMENTS

CN    101321295 A    12/2008
CN    102460700 A    5/2012
(Continued)

OTHER PUBLICATIONS

Singapore Patent Application No. 11201706246X Search and Opinion dated Dec. 29, 2017, 7 pages.
(Continued)

*Primary Examiner* — Antoinette T Spinks
(74) *Attorney, Agent, or Firm* — Lathrop Gage LLP

(57) ABSTRACT

The present disclosure discloses an image sensor, an imaging device, a mobile terminal and an imaging method. The image sensor comprises a photosensitive pixel array and a filer arranged on the photosensitive pixel array. The filter comprises a filer unit array comprised a plurality of filter units, wherein each filter unit covers N photosensitive pixels, and some of the filter units comprise white filter areas. The white filter areas cover at least one of the N photosensitive pixels of the N photosensitive pixels, wherein a merged pixel is formed by the N photosensitive pixels covered by the same filter unit, wherein N is a positive integer.

16 Claims, 11 Drawing Sheets

(51) Int. Cl.
  *H04N 5/347* (2011.01)
  *H04N 9/07* (2006.01)
  *H01L 27/146* (2006.01)
  *H04N 5/378* (2011.01)

(52) U.S. Cl.
  CPC ....... *H01L 27/14645* (2013.01); *H04N 5/347* (2013.01); *H04N 5/378* (2013.01); *H04N 9/045* (2013.01); *H04N 9/07* (2013.01)

(56) References Cited

U.S. PATENT DOCUMENTS

| | | |
|---|---|---|
| 2009/0200451 A1 | 8/2009 | Conners |
| 2012/0019696 A1 | 1/2012 | Tai et al. |
| 2013/0242148 A1 | 9/2013 | Mlinar et al. |
| 2014/0267828 A1* | 9/2014 | Kasai .................... H04N 9/045 348/229.1 |
| 2015/0138366 A1 | 5/2015 | Keelan et al. |
| 2015/0138407 A1 | 5/2015 | Kawaguchi et al. |
| 2015/0350583 A1 | 12/2015 | Mauritzson et al. |

FOREIGN PATENT DOCUMENTS

| | | |
|---|---|---|
| CN | 103703413 A | 4/2014 |
| CN | 102450020 B | 7/2014 |
| CN | 104025577 A | 9/2014 |
| CN | 104184967 A | 12/2014 |
| CN | 104280803 A | 1/2015 |
| CN | 104429060 A | 3/2015 |
| CN | 204720451 U | 10/2015 |
| CN | 105516697 A | 4/2016 |
| CN | 105578006 A | 5/2016 |
| CN | 105578066 A | 5/2016 |
| CN | 105578071 A | 5/2016 |
| CN | 105578078 A | 5/2016 |
| JP | 2010-136225 A | 6/2010 |

OTHER PUBLICATIONS

Chinese Patent Application No. 201510963465.1 Third Office Action dated Jan. 8, 2018, 6 pages.
Chinese Patent Application No. 201510963465.1 English translation of Third Office Action dated Jan. 8, 2018, 7 pages.
Japanese Patent Application No. 2017541006 Office Action dated Dec. 26, 2017, 4 pages.
Chinese Patent Application No. 201510963465.1 Office Action dated Feb. 13, 2017 with English translation, 22 pages.
PCT/CN2016/099753 English translation of the International Search Report dated Nov. 30, 2016, 4 pages.
Chinese Patent Application No. 201510963465.1 Second Office Action dated Aug. 10, 2017 with English translation, 25 pages.
European Patent Application No. 16874606.3 extended Search and Opinion dated Mar. 26, 2018, 7 pages.
Indian Patent Application No. 201737030081 Office Action dated Sep. 25, 2019, 5 pages.

\* cited by examiner

IMAGE SENSOR, IMAGING DEVICE, MOBILE TERMINAL AND IMAGING METHOD FOR PRODUCING HIGH RESOLUTION IMAGE

CROSS-REFERENCE TO RELATED APPLICATION

This application claims priority to and the benefit of Chinese Patent Application No. 201510963465.1, filed with the State Intellectual Property Office of P. R. China on Dec. 18, 2015. The entire contents of the above-identified application are incorporated herein by reference.

FIELD

The present disclosure relates to imaging technologies, and more particularly to an image sensor, an imaging device, a mobile terminal, and an imaging method of the image sensor.

BACKGROUND

In the related art, the imaging sensor of the imaging device may have a problem of larger noise and lower resolution in an image generated in low light.

SUMMARY

The present disclosure aims to solve at least one of the problems existing in the related art to at least some extent.

In order to achieve the above purposes, embodiments of a first aspect of the present disclosure provide an image sensor. The image sensor includes: a photosensitive pixel array and a filter arranged on the photosensitive pixel array. The filter comprises a filer unit array having a plurality of filter units, wherein each filter unit covers N photosensitive pixels, some of the filter units at least include white filter areas. The white filter areas cover at least one of the N photosensitive pixels. A merged pixel is formed by the N photosensitive pixels covered by the same filter unit, wherein N is a positive integer.

According to the image sensor provided in embodiments of the present disclosure, the amount of light entering into the image sensor can be increased through embedding the white filter areas into some of the filter units, so that a higher signal to noise ratio, higher brightness, higher sharpness and less noise image can be obtained in low light.

According to some embodiments of the present disclosure, the filter unit array includes R filter units, G filter units, and B filter units, wherein the G filter units at least include the white filter areas, and the white filter areas cover at least one of the N photosensitive pixels covered by the G filter units.

According to some embodiments of the present disclosure, each filter unit includes 2*2 photosensitive pixels, wherein the white filter areas cover one photosensitive pixel covered by the G filter unit, and the G filter unit further includes green filter areas, wherein the green filter areas cover the other three photosensitive pixels. Or the white filter areas cover two photosensitive pixels covered by the G filter unit, and the G filter unit further includes green filter areas, wherein the green filter areas cover the other two photosensitive pixels. Or the white filter areas cover three photosensitive pixels covered by the G filter unit, and the G filter unit further includes green filter areas, wherein the green filter areas cover the other one photosensitive pixel. Or the white filter areas cover all of the four photosensitive pixels covered by the G filter unit.

According to some embodiments of the present disclosure, the image sensor further includes a control module, which is configured to control the photosensitive pixel array to be exposed by row.

According to some embodiments of the present disclosure, the image sensor further includes a register. The control module is configured to collect outputs of the photosensitive pixels of row k and row k+1 in turn which have been exposed and to store the outputs into the register, wherein k=2n−1, n is a positive integer, and k+1 is less than or equal to the amount of the rows of the photosensitive pixel array.

According to some embodiments of the present disclosure, the image sensor further includes an ADC (Analog-to-digital converter) array which includes a plurality of ADCs, wherein each of the ADCs connects to one photosensitive pixel.

According to some embodiments of the present disclosure, the image sensor further includes a micro-lens array, each micro-lens corresponds to one photosensitive pixel.

In order to achieve the above purposes, embodiments of a second aspect of the present disclosure provide an imaging device including the image sensor. The imaging device including the image sensor according to embodiments of the present disclosure includes the above-identified image sensor and an image signal processor, wherein the image signal processor is configured to read and to process the outputs of the photosensitive pixel array of the image sensor in order to obtain the pixel value of the merged pixels and further to obtain merged images.

With the imaging device provided in embodiments of the present disclosure, the amount of light entering into the image sensor can be increased by the provided image sensor mentioned above, so that a higher signal to noise ratio, higher brightness, higher sharpness and less noise image can be obtained in low light.

According to some embodiments of the present disclosure, when the filter units only include white filter areas or non-white filter areas, the image signal processor is further configured to add the outputs of the N photosensitive pixels corresponding to the same merged pixel together and to make the result as the pixel value of the merged pixel.

According to some embodiments of the present disclosure, when the filter units include the white filter areas and the non-white filter areas, the image signal processor is further configured to add the outputs of the photosensitive pixels corresponding to the white filter areas together to obtain a first pixel value of the merged pixel, and to add the outputs of the photosensitive pixels corresponding to the non-white filter areas together to obtain a second pixel value of the merged pixel.

As the noise of merged pixels is less than the sum of noise of all the photosensitive pixels before being merged, it could improve the signal to noise ratio, brightness, and sharpness, and reduce noise of an image in low light via the merged pixels.

In order to achieve the above purposes, embodiments of a third aspect of the present disclosure provide a mobile terminal. The mobile terminal, according to embodiments of the present disclosure, includes the above-identified imaging device for a mobile terminal.

With the mobile terminal provided in embodiments of the present disclosure, the amount of light entering into the imaging device can be increased by the provided imaging device mentioned above, so that a higher signal to noise ratio, higher brightness, higher sharpness and less noise image can be obtained in low light, and further, as the noise of merged pixels is less than the sum of noise of all the photosensitive pixels, it could improve the signal to noise ratio, brightness, and sharpness, and reduce noise of an image in low light via the merged pixels.

According to some embodiments of the present disclosure, the mobile terminal includes a cell phone.

According to some embodiments of the present disclosure, the imaging device includes front cameras.

According to some embodiments of the present disclosure, the mobile terminal further comprises a CPU and an external memory, which are connected with the imaging device separately, wherein the CPU is configured to control the external memory to store the merged images.

According to some embodiments of the present disclosure, the mobile terminal further includes a display device, which is connected with the imaging device, wherein the CPU is configured to control the display device to display the merged images.

In order to achieve the above purposes, embodiments of a fourth aspect of the present disclosure provide an imaging method of the image sensor. The imaging method, according to embodiments of the present disclosure, includes: reading outputs of the photosensitive unit array; calculating pixel value of the merged pixel according to the outputs of the photosensitive pixels of the same merged pixel to obtain a merged image.

According to the imaging method provided in embodiments of the present disclosure, the amount of light entering into the imaging device can be increased by the provided image sensor mentioned above, so that a higher signal to noise ratio, higher brightness, higher sharpness and less noise image can be obtained in low light.

According to some embodiments of the present disclosure, each filter unit includes 2*2 photosensitive pixels. The step of calculating pixel value of the merged pixel according to the outputs of the photosensitive pixels of the same merged pixel further comprises: collecting and storing the outputs of the photosensitive pixels of row k and row k+1 into the register, wherein k=2n−1, n is a positive integer, and k+1 is less than or equal to the amount of the rows of the photosensitive pixel array; and extracting the outputs of the photosensitive pixels of row k and row k+1 from the register to obtain the pixel value of the merged pixels.

According to some embodiments of the present disclosure, when the filter units only include the white filter areas or the non-white filter areas, the step of calculating pixel value of the merged pixel according to the outputs of the photosensitive pixels of the same merged pixel further comprises: adding the outputs of the N photosensitive pixels corresponding to the same merged pixel together and making the result as the pixel value of the merged pixel.

According to some embodiments of the present disclosure, when the filter units include the white filter areas and the non-white filter areas, the pixel value of the merged pixel includes a first pixel value corresponding to the white filter areas and a second pixel value corresponding to the non-white filter areas. The step of calculating pixel value of the merged pixel according to the outputs of the photosensitive pixels of the same merged pixel further comprises: adding the outputs of the photosensitive pixels corresponding to the white filter areas together to obtain the first pixel value of the merged pixel; and adding the outputs of the photosensitive pixels corresponding to the non-white filter areas together to obtain the second pixel value of the merged pixel.

As the noise of merged pixels is less than the sum of noise of all the photosensitive pixels, it could improve the signal to noise ratio, brightness, and sharpness, and reduce noise of an image in low light via the merged pixels.

According to some embodiments of the present disclosure, each ADC connects to one photosensitive pixel, the imaging method further includes: converting analog signal outputs of the photosensitive pixel into digital signal outputs; and calculating the pixel value of the merged pixel according to the digital signal outputs of the photosensitive pixels of the same merged pixel.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
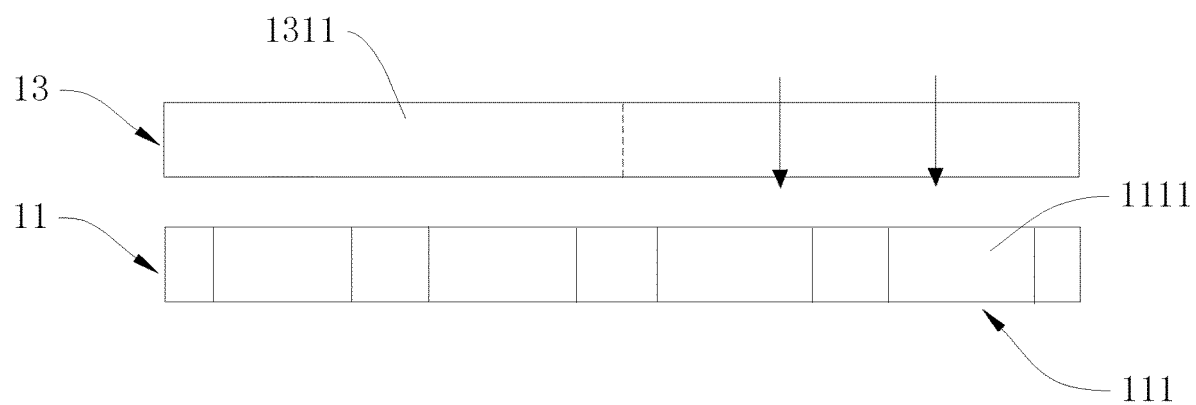
FIG. 1 is a schematic side view of an exemplary image sensor according to an embodiment of the present disclosure.
Figure 2A:
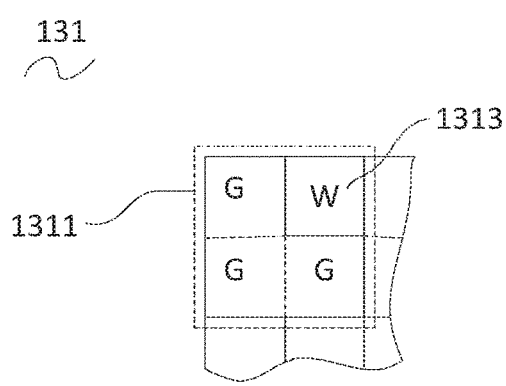
FIG. 2a-2d are schematic views of an exemplary filter units of the image sensor according to an embodiment of the present disclosure.
Figure 2B:
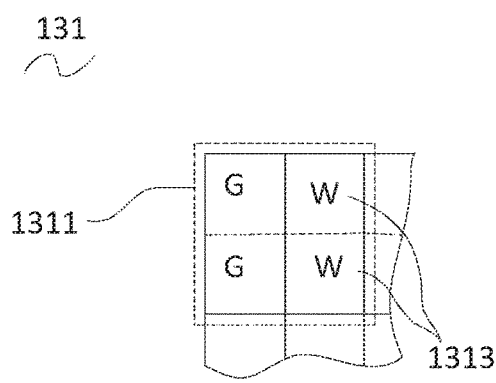
Figure 2C:
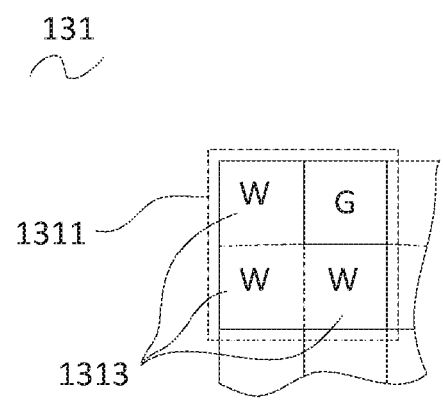
Figure 2D:
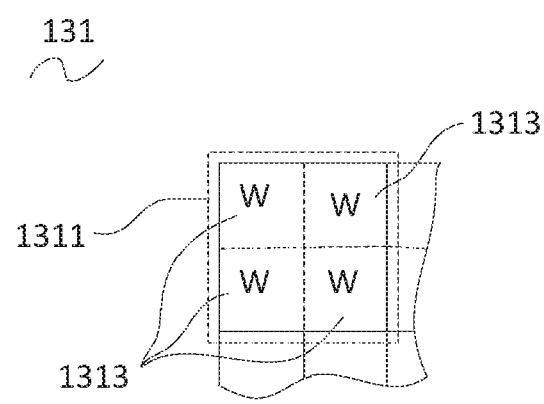

Reference will be made in detail to embodiments of the present disclosure. Embodiments of the present disclosure will be shown in drawings, in which the same or similar elements and the elements having same or similar functions are denoted by like reference numerals throughout the descriptions. The embodiments described herein according to drawings are explanatory and illustrative, not construed to limit the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

In the description of the present disclosure, it should be noted that, unless specified or limited otherwise, the terms "mounted," "connected," and "coupled" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

An image sensor, an imaging device, a mobile terminal and an imaging method, according to embodiments of the present disclosure, may be described below with reference to FIGS. 1-15.

In some embodiments, as shown in FIG. 1 and FIGS. 2a-2d, the image sensor 10 includes a photosensitive pixel array 11 and a filter 13.

Wherein, the filter 13 is arranged on the photosensitive pixel array 11 and includes a filter unit array 131. The filter unit array 131 includes a plurality of filter units 1311. Each filter unit 1311 covers N photosensitive pixels 111. Some of the filter units 1311 at least include a white filter area 1313. The white filter area 1313 covers at least one of the N photosensitive pixel 111. The N photosensitive pixels 111 covered by the same filter unit 1311 forms a merged pixel, and N is a positive integer. External light illuminates the photosensitive part 1111 of a photosensitive pixel 111 to generate electric signal, which is the output of a photosensitive pixel 111.

It should be noted that, the white filter areas 1313 is configured to allow the light pass through instead of being filtered. Such that, the white filter areas 1313 may refers to either the areas covered by the transparent filters or the areas with no filters, the areas with no filters is the hollow of the filter 13.

It should be further noted that, the other filter units 1311 except the filter units 1311 with the white filter area 1313 include non-white filter areas, such as green filter area, red filter area or blue filter area. When the number of the photosensitive pixels covered by the white filter area 1313 is less than N, the filter units 1311 with white filter area 1313 further include the non-white filter area. In other words, some filter units 1311 consist of the white filter area and the non-white filter area at the same time. The two areas cover N photosensitive pixels together. Wherein, the non-white filter area is configured to obtain color information of the merged pixels, and the white filter area is configured to obtain white light information. In other words, the white filter area may allow the light pass through. Such that, the brightness is higher which is outputted by the photosensitive with the better effect of light transmission of the white filter area. White filter area is further configured to obtain the brightness information of the merged pixels in low light, and the noise of the brightness information is less.

With the image sensor provided in embodiments of the present disclosure, the amount of light entering into the image sensor can be increased through embedding the white filter areas into some of the filter units, so that a higher signal to noise ratio, higher brightness, higher sharpness and less noise image can be obtained in low light.

Figure 3:
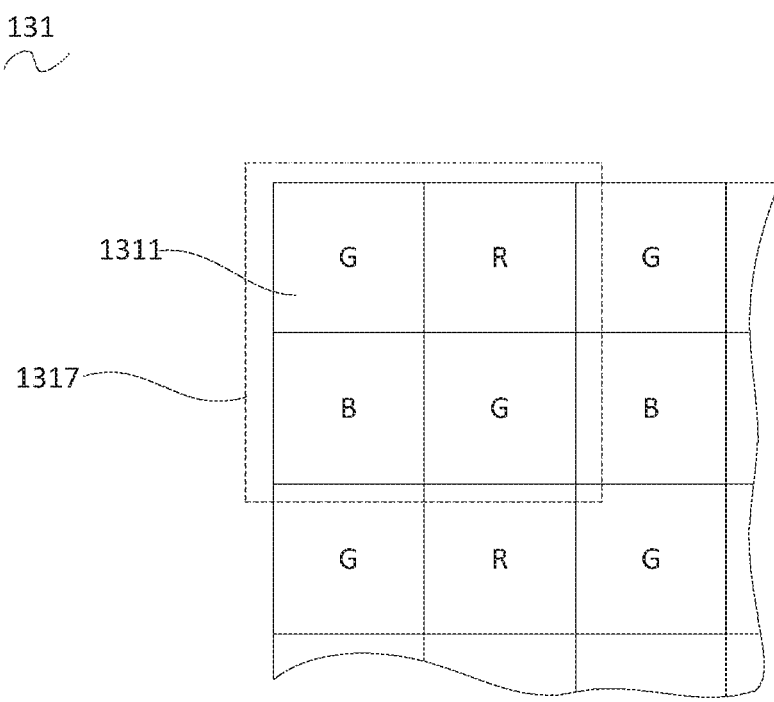
FIG. 3 is a schematic view of an exemplary Bayer Color Filter Array according to an embodiment of the present disclosure.

In some embodiments, the filter unit array shown in FIG. 3 is arranged according to the Bayer Color Filter Array (Bayer Pattern). Wherein, the Bayer pattern includes a filter structure 1317, and each filter structure 1317 includes filter units 1311 2 by 2, which are green, red, blue and green filter units.

With the Bayer pattern, algorithm for the traditional Bayer pattern can be used to process the image signal instead of changing the structure of hardware.

In some embodiments, as shown in FIGS. 4a-4d, the filter unit array 131 includes R (red) filter units 1311, G (green) filter units 1311 and B (Blue) filter units 1311, wherein, the G filter units 1311 at least include the white filter areas 1313. The white filter areas cover at least one of the N photosensitive pixel 111 covered by the G filter units.

Specifically, in traditional filter unit array structure, one photosensitive pixel corresponds to one filter unit. In some embodiments of the present disclosure, the filter unit array 131 may configure to use Bayer pattern, which includes the filter structure 1317. Each filter structure 1317 includes R, B and G filter units 1311. In this embodiment, one filter unit 1311 corresponds to N photosensitive pixels, which is different from the traditional structure.

Wherein, each G filter unit 1311 includes a white filter area 1315 which is corresponding to at least one of the N photosensitive pixels 111. When the number of photosensitive pixels 111 covered by the white filter area 1315 is less than N, the G filter unit 1311 further includes a green filter area 1315, wherein the green filter area 1315 corresponds to the other photosensitive pixels of N. Furthermore, the R filter units 1311 only include the red filter area. In other words, one red filter unit 1311 cover 4 photosensitive pixels corresponding to one R filter unit 1311. Similarly, the B filter units 1311 only include the blue filter area. In other words, one blue filter unit 1311 cover 4 photosensitive pixels corresponding to one B filter unit 1311.

As shown in FIGS. 4a-4d and FIGS. 5a-5d, each filter unit 1311 includes 2*2 photosensitive pixels, in other words, each filter unit 1311 covers 2*2 photosensitive pixels to form a merged pixel.

In some embodiments, concerning the structure of the merged pixel, in addition to the structure of 2*2, there may be the structure of 3*3, 4*4, and any n*m (n and m are the positive integer respectively). It is to be understood that, since the number of the photosensitive pixels 111 arranged on the photosensitive pixel array 11 is limited, if each merged pixel includes too many photosensitive pixels, the resolution of the image is limited. For example, when the pixel value of the photosensitive pixel array 11 is 16M (mega), if the structure of 2*2 photosensitive pixels is used, a 4M-resolution image will be obtained, and if the structure of 4*4 is used, a 1M-resolution image will be obtained. Therefore, the structure of 2*2 photosensitive pixels is a better arrangement, which can enhance brightness and sharpness of the image under the premise of sacrificing less resolution as possible. At the same time, it is easy to realize to merge the photosensitive pixels and to read out the outputs of the photosensitive pixels in hardware aspect with the structure of 2*2 photosensitive pixels.

Figure 4A:
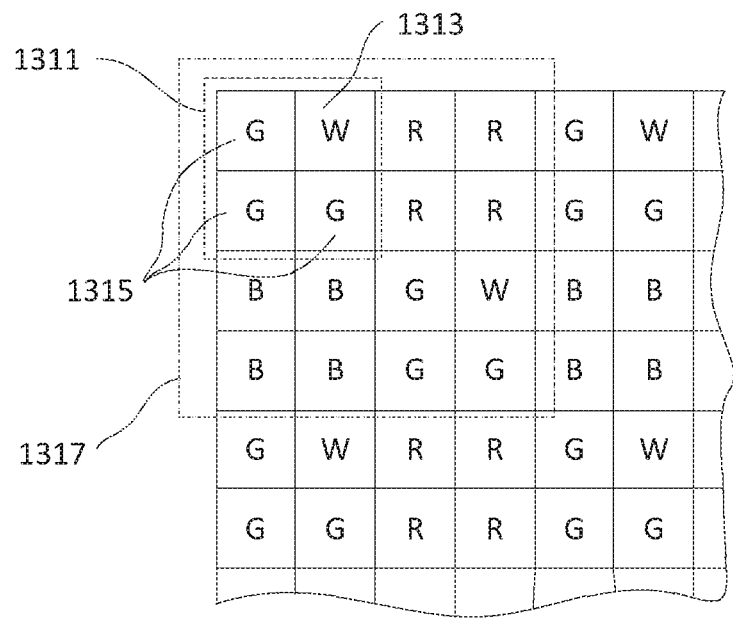
FIG. 4a-4d are schematic views of an exemplary filter unit array of the image sensor according to an embodiment of the present disclosure.
Figure 4B:
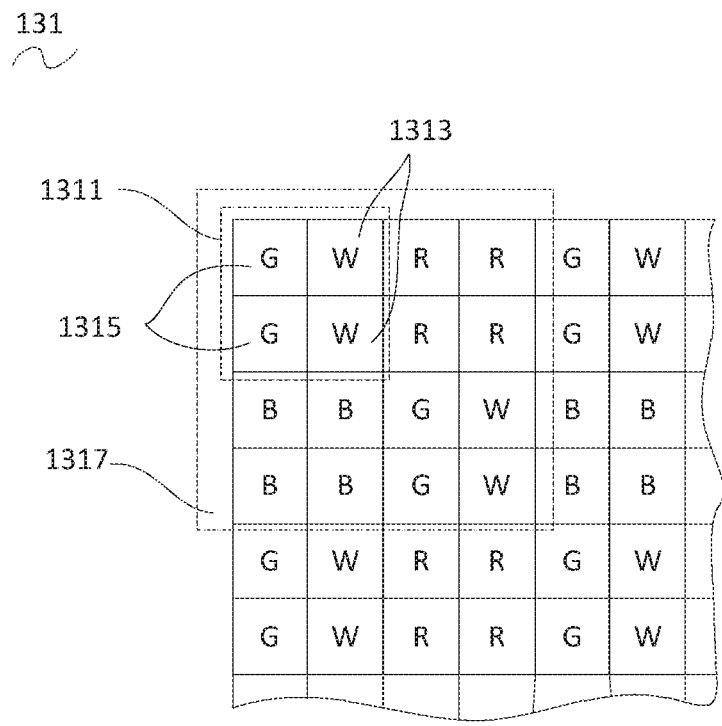
Figure 4C:
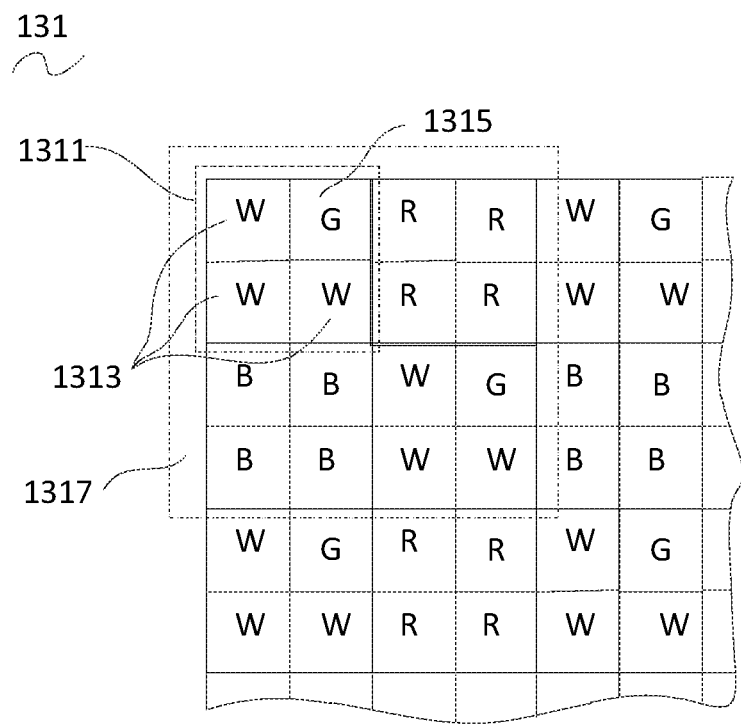
Figure 4D:
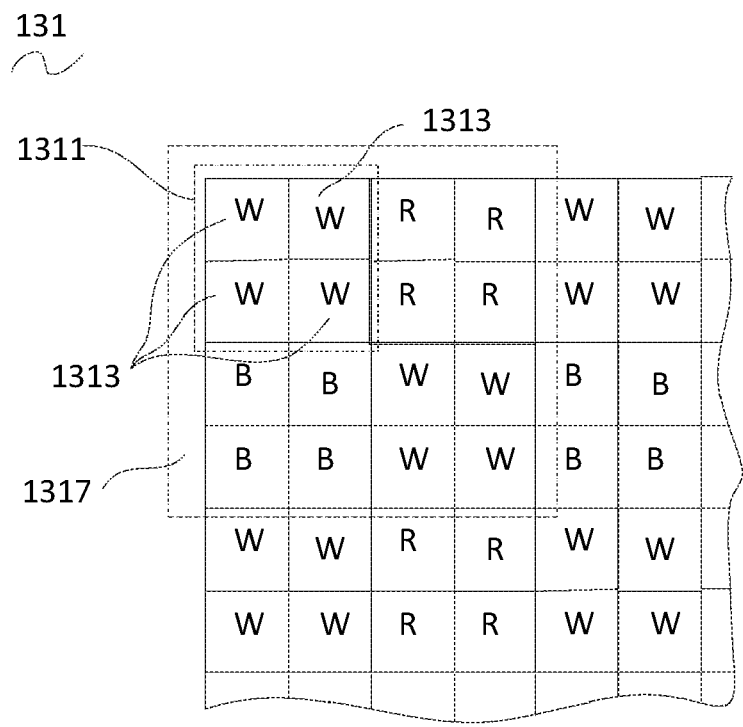
Figure 5A:
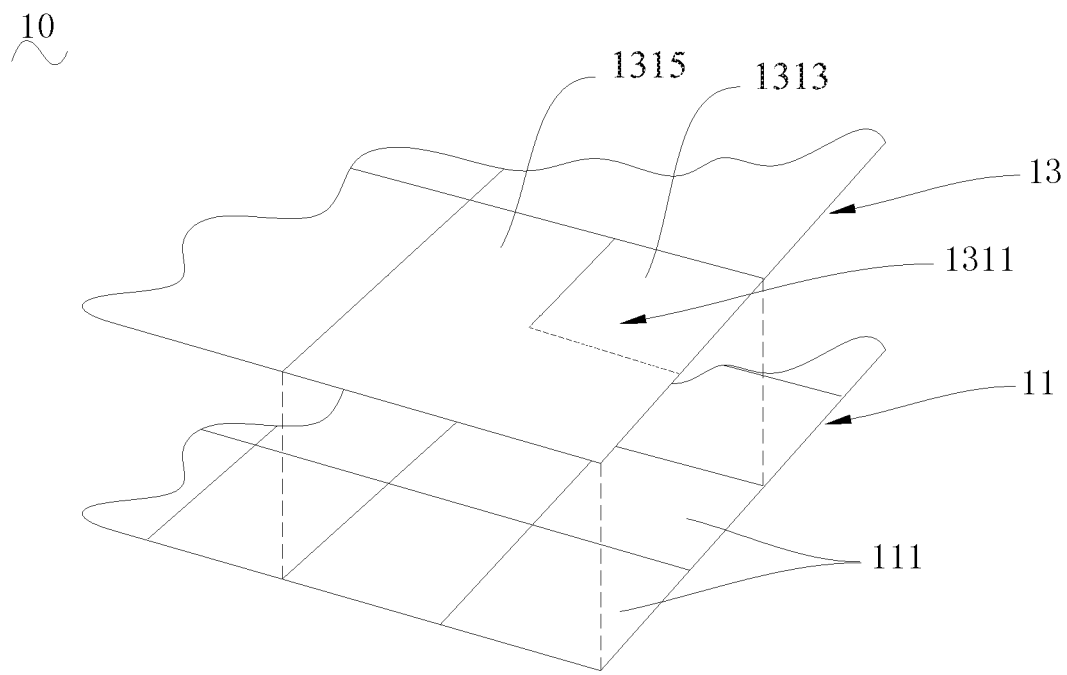
FIG. 5a-5d are schematic views of structure of an exemplary image sensor according to an embodiment of the present disclosure.
Figure 5B:
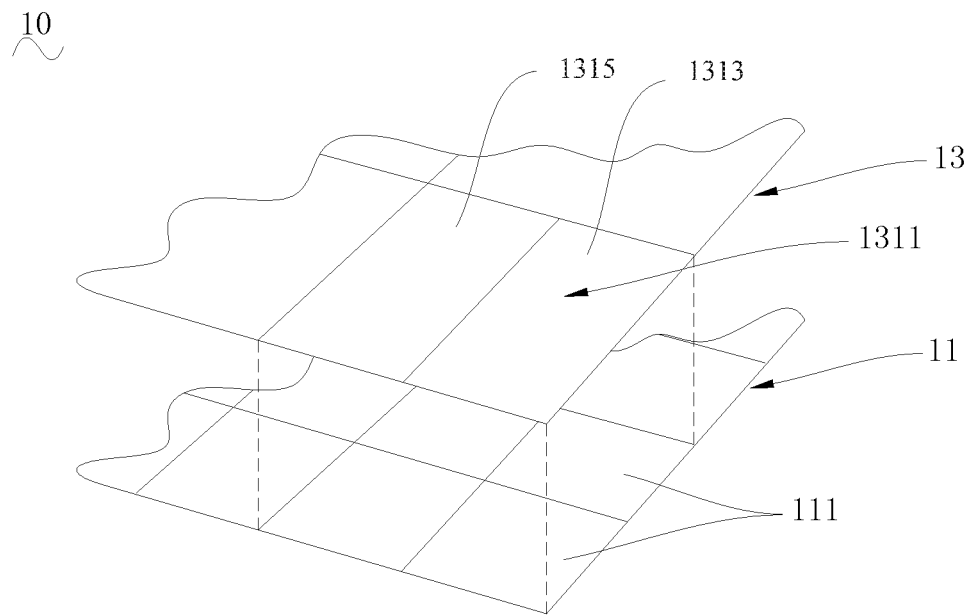
Figure 5C:
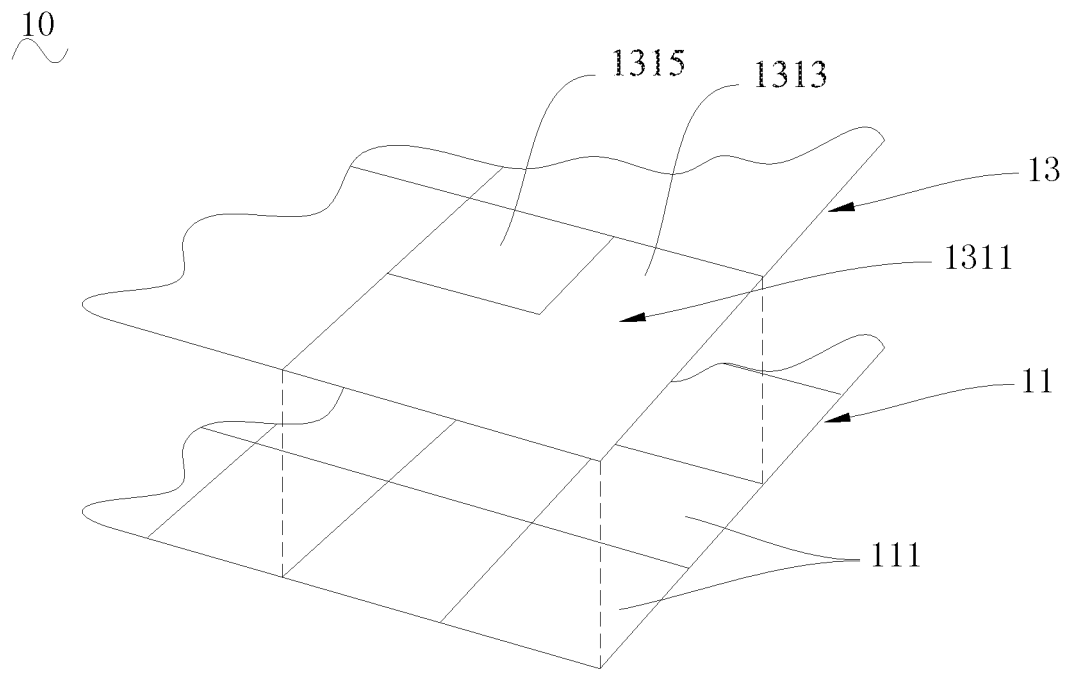
Figure 5D:
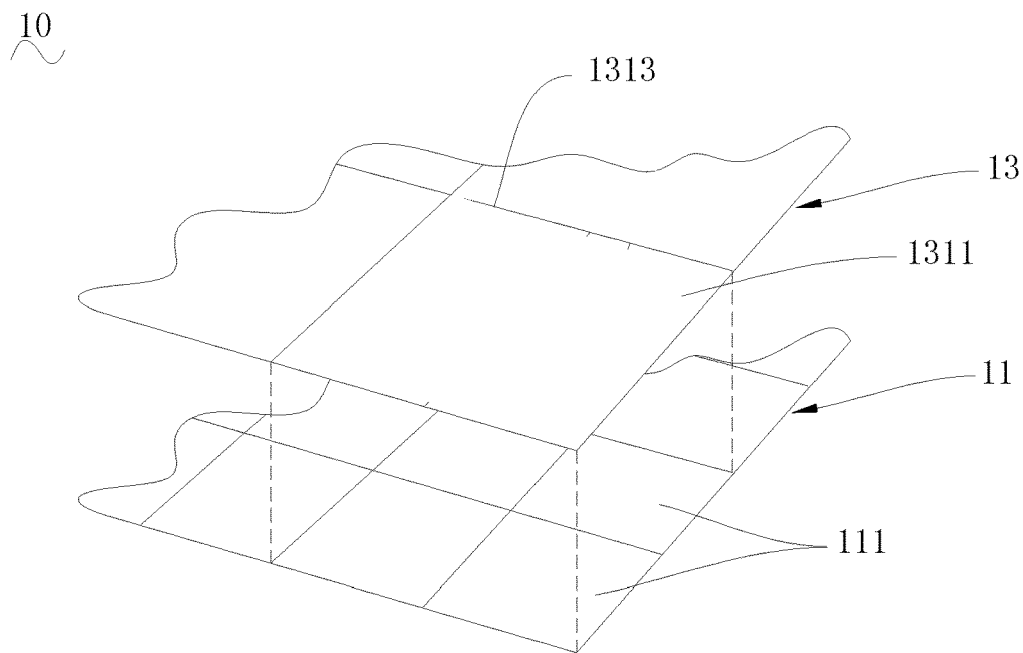

As shown in FIGS. 4a and 5a, a white filter area 1313 covers one photosensitive pixel covered by the G filter unit 1311, wherein, the G filter unit 1311 further includes a green filter area 1315 and the green filter area 1315 covers the other 3 of 4 photosensitive pixels. Or as shown in FIGS. 4b and 5b, a white filter area 1313 covers 2 photosensitive pixels covered by the G filter unit 1311, wherein, the G filter unit 1311 further includes a green filter area 1315 and the green filter area 1315 covers the other 2 of 4 photosensitive pixels. Or as shown in FIGS. 4c and 5c, a white filter area 1313 covers 3 photosensitive pixels covered by the G filter unit 1311, wherein, the G filter unit 1311 further includes a green filter area 1315 and the green filter area 1315 covers the other 1 of 4 photosensitive pixels. Or as shown in FIGS. 4d and 5d, a white filter area 1313 covers 4 photosensitive pixels covered by the G filter unit 1311.

Such that, in a G filter unit 1313, N photosensitive pixels 111 of a merged pixel can be covered by the non-white filter area 1315 which is the green filter area and the white filter area 1313 together, or N photosensitive pixels 111 of a merged pixel can be only covered by the white filter area 1313. In some embodiments, in a R filter unit 1313, N photosensitive pixels 111 of a merged pixel can be only covered by the non-white filter area 1313, which is the red filter area. In some embodiments, in a B filter unit 1313, N photosensitive pixels 111 of a merged pixel can be only covered by the non-white filter area 1313, which is the blue filter area.

Figure 6:
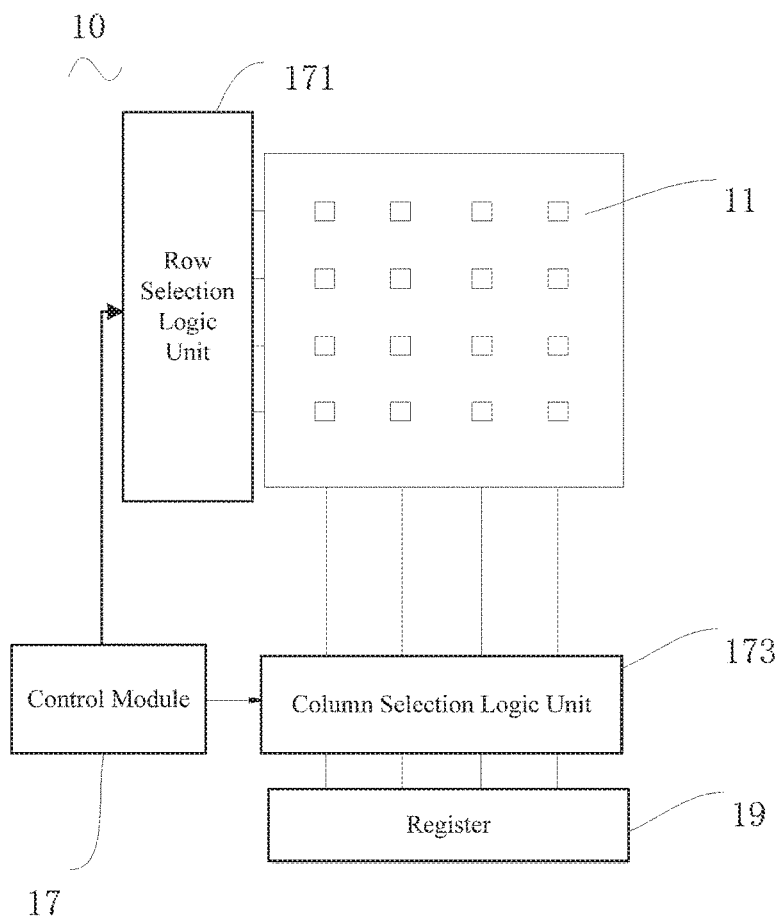
FIG. 6 is a schematic block diagram of an exemplary image sensor according to an embodiment of the present disclosure.

In some embodiment, as shown in FIG. 6, the image sensor further includes a control module 17, which is configured to control the photosensitive pixel array 11 to expose by row. In detail, the control module 17 is connected with a row selection logic unit 171 and a column selection logic unit 173, such that the control module 17 is configured to process the outputs of the photosensitive pixels 111 by row.

Exposing and outputting by row can be realized easier in hardware aspect.

Further, as shown in FIG. 6, the image sensor includes a register 19, The control module 17 is configured to collect outputs of the photosensitive pixels 111 of row k and row k+1 in turn which have been exposed and to store the outputs into the register 19, wherein k=2n−1, n is a positive integer, and k+1 is less than or equal to the amount of the rows of the photosensitive pixel array 11.

Such that, reading outputs, buffering and merging the photosensitive units can be realized by adopting the register. Reading outputs, buffering and merging the photosensitive units can be realized easier and processed faster by hardware.

Figure 7:
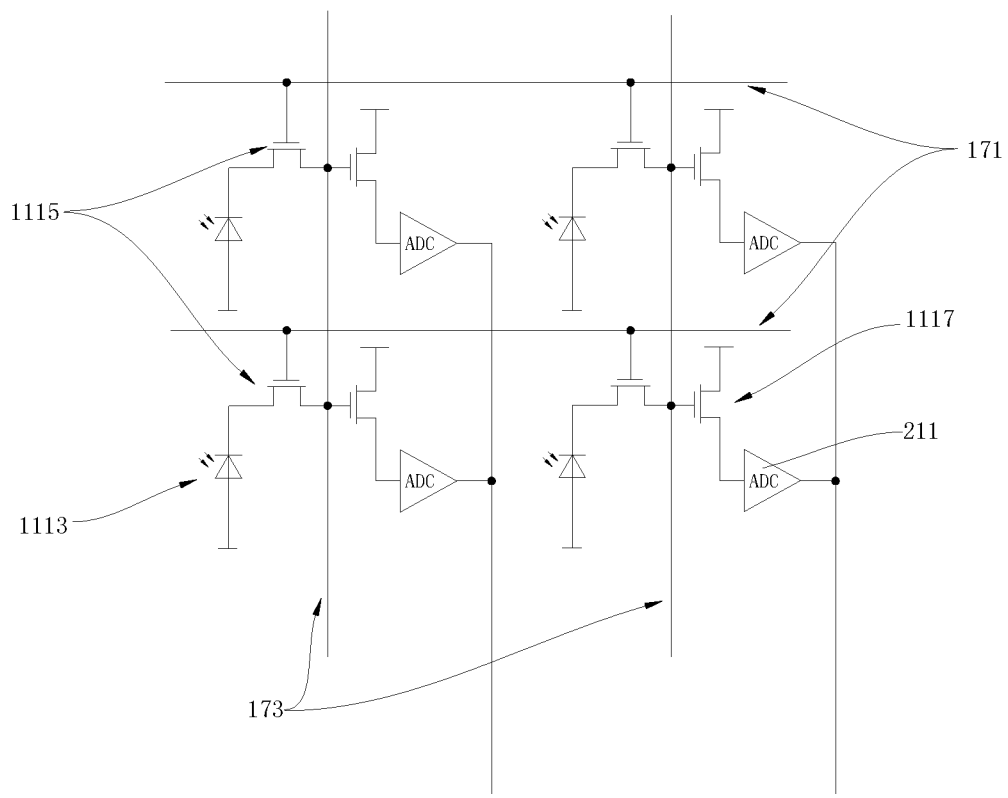
FIG. 7 is a schematic circuit diagram of an exemplary photosensitive pixel of the image sensor according to an embodiment of the present disclosure.

In detail as shown in FIGS. 6 and 7, the image sensor 10 includes a row selection logic unit 171 and a column selection logic unit 173, wherein the control module 17 is connected with a row selection logic unit 171 and a column selection logic unit 173, row selection logic unit 171 and the column selection logic unit 173 connects with each time gate 1115 corresponding to the photosensitive pixel 111. The control module 17 is configured to control the row selection logic unit 171 and the column selection logic unit 173 to conduct the time gate 1115 of the photosensitive pixel 111 in specific position.

The control module 17 is configured to collect outputs of the first and the second row the photosensitive pixels and to store the outputs into the register 19. The circuit of the image sensor is configured to process the outputs of the four photosensitive pixels in position 1-1, 1-2, 2-1 and 2-2 and to obtain the pixel value of the merged pixel, wherein the number in the left of the position means the row of the photosensitive pixels and the number in the right means the column.

Then, the circuit of the image sensor is configured to process the outputs of the 4 photosensitive pixels in position 1-3, 1-4, 2-3 and 2-4 to obtain the pixel value of the corresponding merged pixel.

And also, the outputs of the third and the fourth row and the fifth and the sixth row of the photosensitive pixels will be processed in the way which is mentioned above, and the processing will not be accomplished until outputs of all photosensitive pixels have been processed.

Figure 8:
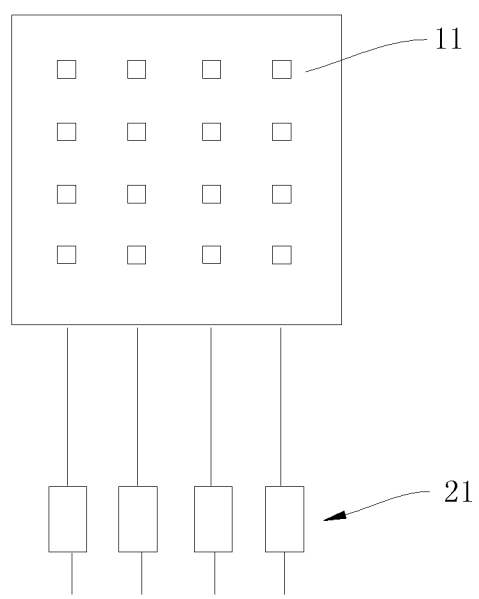
FIG. 8 is a schematic block diagram of an exemplary image sensor according to an embodiment of the present disclosure.

In some embodiments, as shown in FIGS. 7 and 8, the image sensor 10 further includes ADCs 21, wherein each ADC 21 is configured to connect to one photosensitive 111 and to convert analog signal outputs of the photosensitive 111 to digital signal outputs.

In some embodiments, as shown in FIG. 7, a photosensitive pixel 111 includes a photodiode 1113. The photodiode 1113 is configured to convert the light to charge, and the charge is proportional to light intensity. The time gate 1115 is configured to conduct the circuit according to the control signals of the row selection logic unit 171 and the column selection logic unit 173. When the circuit is conducted, the source follower 1117 is configured to convert a charge signal generated by exposure of the photodiode 1113 to a voltage signal. The ADC 211 is configured to convert the voltage to a digital signal so that to transmit the digital to following circuit to process.

The processing way mentioned above converts the outputs of the photosensitive pixels to the digital signal, so that the digital signal can be processed in the following digital circuit or by the program in a chip. The output information of every photosensitive pixel can be conserved. In one embodiment, for an image sensor with 16M pixels, the imaging method of the present disclosure, the information of the 16M pixels which means the image before being merged can be conserved, and then a 4M pixels merged image or other solution images can be obtained by processing on basis of the 16M pixels information. The probability of defective pixels in the generated image is lower. Furthermore, the noise of output of the processing way mentioned above is smaller, and signal to noise ratio is higher.

Figure 9:
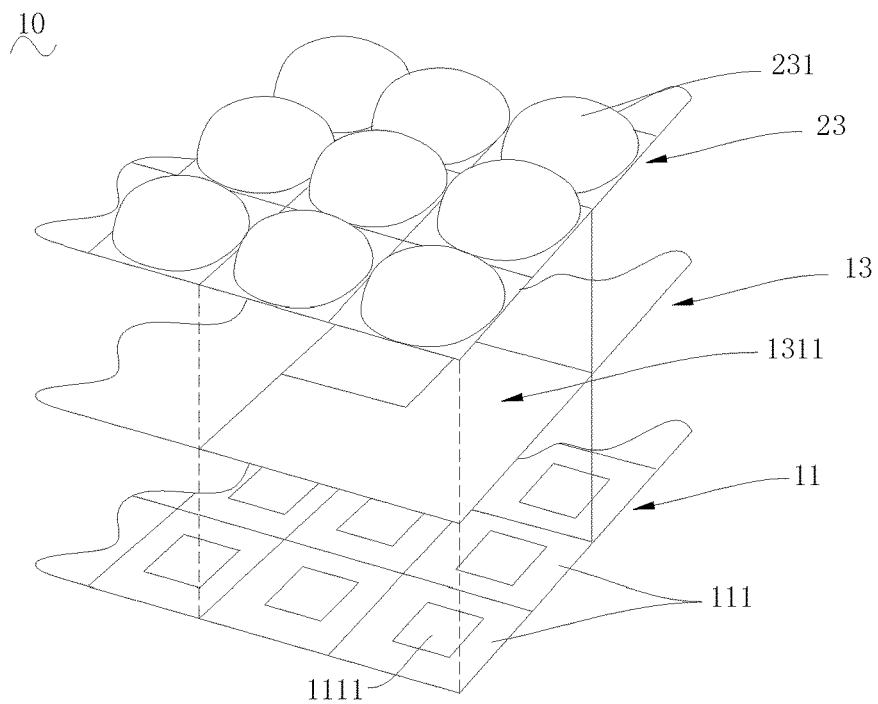
FIG. 9 is a schematic view of structure of an exemplary image sensor according to an embodiment of the present disclosure.

In some embodiment, as shown in FIG. 9, the image sensor 10 includes a micro-lens array 23 which is arranged on the filter 13, wherein each micro-lens is configured to correspond to a photosensitive pixel 111.

In detail, each micro-lens 231 corresponds to a photosensitive pixel 111, which means to correspond with the size and the position. In some embodiments, each filter unit 1311 corresponds to 2*2 photosensitive pixels 111 and 2*2 micro-lenses 191. With the development of technology, in order to obtain a higher resolution image, the number of the photosensitive pixels 111 becomes more and more, and the density of arrangement of the photosensitive pixels is higher. The photosensitive pixel 111 is getting smaller and smaller and its light reception capability will be affected. And the area of photosensitive part 1111 of the photosensitive pixel 111 is limited. The micro-lens 191 can gather light together on the photosensitive part 1111, so that the light reception capability of the photosensitive pixel 111 and the quality of images can be promoted.

In summary, according to the image sensor in the embodiments of the present disclosure, embedding the white filter areas into some of the filter units, so that the brightness information of the merged pixels can be obtained in low light, and the noise of the brightness information is less. The pixel value of a merged image generated by the merged pixels includes both color information and less noise brightness information. Both of the brightness and the sharpness of the merged image are better and the noise of the image is less.

Embodiments of the present disclosure provide an imaging device 100.

Figure 10:
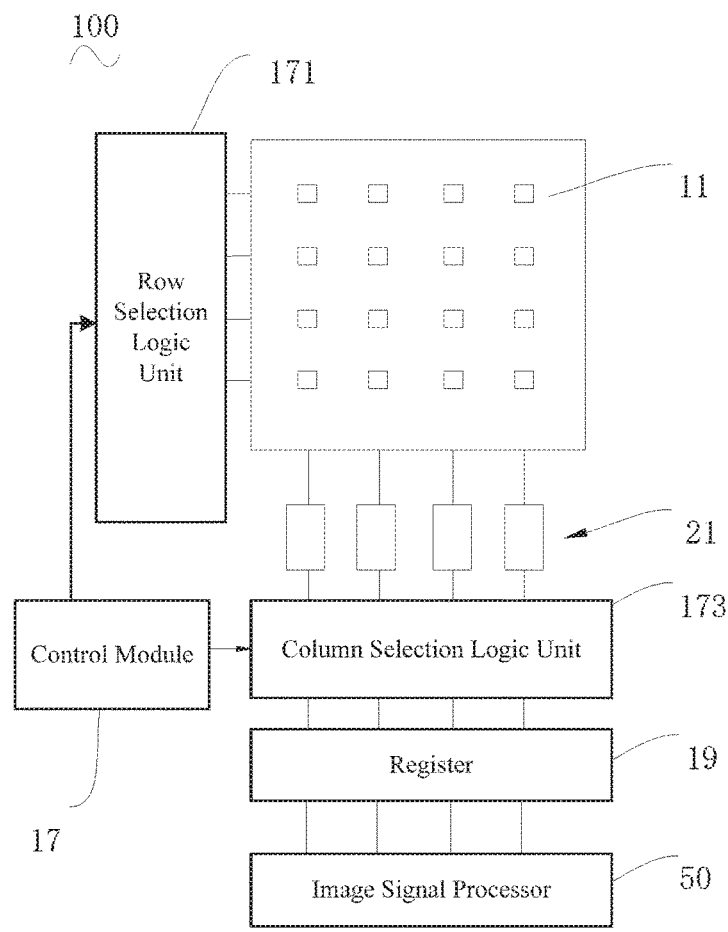
FIG. 10 is a schematic block diagram of an exemplary imaging device according to an embodiment of the present disclosure.

In some embodiments, as shown in FIG. 10, an imaging device 100 including the image sensor 10 according to embodiments of the present disclosure includes the above-identified image sensor 10 and an image signal processor 50 connected with the image sensor 10, wherein the image signal processor 50 is configured to read and to process the outputs of the photosensitive pixel array 11 to obtain the pixel value of the merged pixels and further obtain the merged images.

In detail, the image sensor 10 may include the control module 17, the row selection logic unit 171, the column selection logic unit 173, the ADC array 21 and the register 19. The ADC array 21 is configured to convert the outputs of the photosensitive pixel array 11 to digital signals. The digital signals are being stored into the register 19 by row and transmitted to the image signal processor 50 to process. A merged image can be generated by processing the outputs of all the photosensitive pixels.

Such that, the image signal processor 50 is configured to calculate the pixel value of merged pixels according to the output of the photosensitive pixels of the same merged pixel in order to generate the merged image.

In detail, in some embodiments, when the filter units only include the white filter area or the non-white filter area, the image signal process 50 is further configured to add together outputs of N photosensitive pixels of the same merged pixel and to take the result as the pixel value of the merged pixel.

And also, when the filter units include both of the white filter areas and the non-white filter areas, the image signal processor 50 is further configured to add the outputs of the photosensitive pixels corresponding to the white filter areas together to obtain a first pixel value of the merged pixel, and to add the outputs of the photosensitive pixels corresponding to the non-white filter areas together to obtain a second pixel value of the merged pixel.

In other words, pixel value can be obtained by adding the outputs of the photosensitive pixels covered by the same color filter in every filter unit. As shown in FIG. 4b, in each filter structure, the first pixel value of the merged pixel can be obtained by adding the outputs of the 2 photosensitive pixels covered by the white filter area together, which are in the position of upper left corner and bottom right corner of a G filter unit. And the second pixel value of the merged pixel can be obtained by adding together the outputs of the 2 photosensitive pixels covered by the green filter area. In the B filter unit on the bottom left corner, the pixel value of the merged pixel can be obtained by adding together the 4 photosensitive pixels covered by the blue filter area. In the R filter unit on the upper right corner, the pixel value of the merged pixel can be obtained by adding together the 4 photosensitive pixels covered by the red filter area.

The image signal processor 50 is configured to generated a merged image according to the first pixel value of the merged pixel of G filter unit, the second pixel value of the merged pixel of the G filter unit, the pixel value of the merged pixel of B filter unit and the pixel value of the merged pixel of the R filter unit. Such that, adding together the outputs of a plurality of photosensitive pixels can make signal to noise ratio of the merged pixel higher. For example, in an embodiment of the present disclosure, assuming that the output of each photosensitive pixel is S, the noise of each photosensitive pixel is Ns, the merged pixel includes N photosensitive pixels, such that the pixel value of the merged pixel is N*S, and the noise of the merged pixel is $$\frac{\sqrt{N*Ns^2}}{N},$$

wherein, N is a positive integer which is greater than or equal to 1. It is known that, when N is greater than 1, the noise of merged pixel is less than the sum of the noise of photosensitive pixels before being merged. For example, in an embodiment of the present disclosure, when N equals to 4, the noise of the merged pixel equals to Ns/2, and less than the sum of the noise of the 4 photosensitive pixels 4*Ns. In another hand, the output of the merged pixel equals to the sum of outputs of the 4 photosensitive. Such that, the signal to noise ratio of the merged image has been improved and the noise of the merged image has been reduced and the sharpness of the merged image has been improved in the meantime. In summary, the imaging device according to the embodiments of the present disclosure, embedding the white filter areas into some of the filter units, so that the brightness information of the merged pixels can be obtained in lower light, and the noise of the brightness information is lower. The pixel value of a merged image generated by the merged pixels includes both color information and lower noise brightness information. Both of the brightness and the sharpness of the merged image are better and the noise of the image is less. In the meanwhile, signal to noise ratio and brightness of images in low light can be improved and the noise of the image can be reduced through merging pixels by the image signal processor because of the noise of the merged pixel is less than the sum of the noise of the photosensitive pixels before being merged.

A mobile terminal applies an imaging device is further provided in the present disclosure.

In an embodiment of the present disclosure, the mobile terminal includes the imaging device according to embodiments of the present disclosure. Such that, the mobile terminal is configured to take photos and to generate a merged image with integrity of the color, higher signal to noise ratio and higher sharpness in low light.

The mobile terminal may be a cell phone.

In an embodiment of the present disclosure, the imaging device may be a front camera of a cell phone. The front camera is often used for taking self-portrait, and the requirement of the self-portrait with higher sharpness and normal solution can be satisfied with the mobile terminal of the present disclosure.

Figure 11:
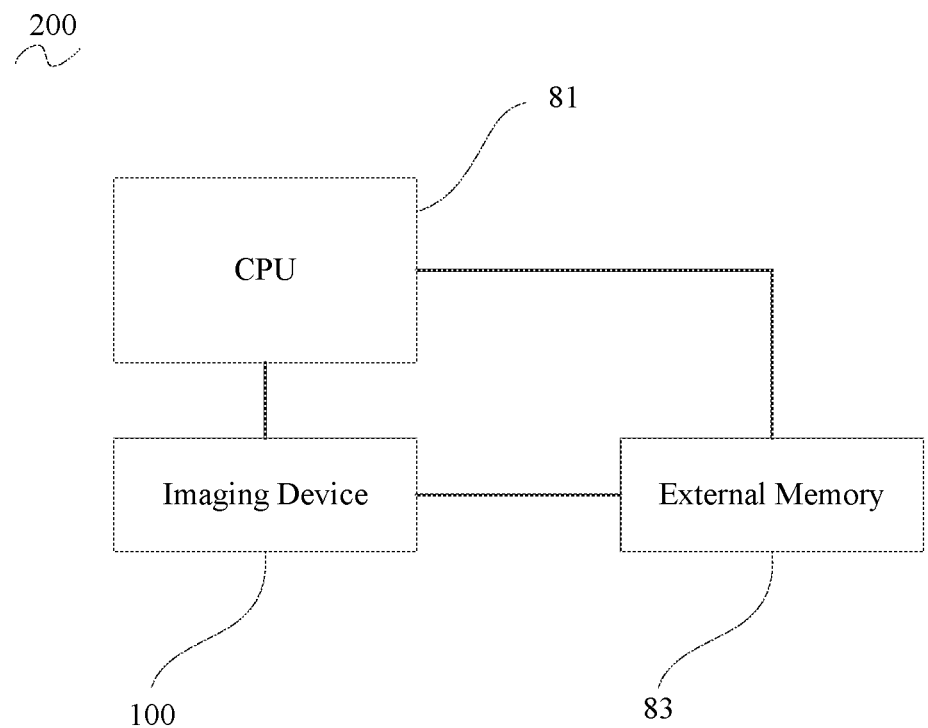
FIG. 11 is a schematic block diagram of an exemplary mobile terminal according to an embodiment of the present disclosure.

Further, as shown in FIG. 11, the mobile terminal 200 includes a CPU 81 and an external memory 83, which are connected with the imaging device 100 separately, wherein the CPU 81 is configured to control the external memory 83 to store the merged images.

Such that, the merged images can be stored for later viewing, using or transferring. The external memory 83 includes a SM (Smart Media) card and a CF (Compact Flash) card.

Figure 12:
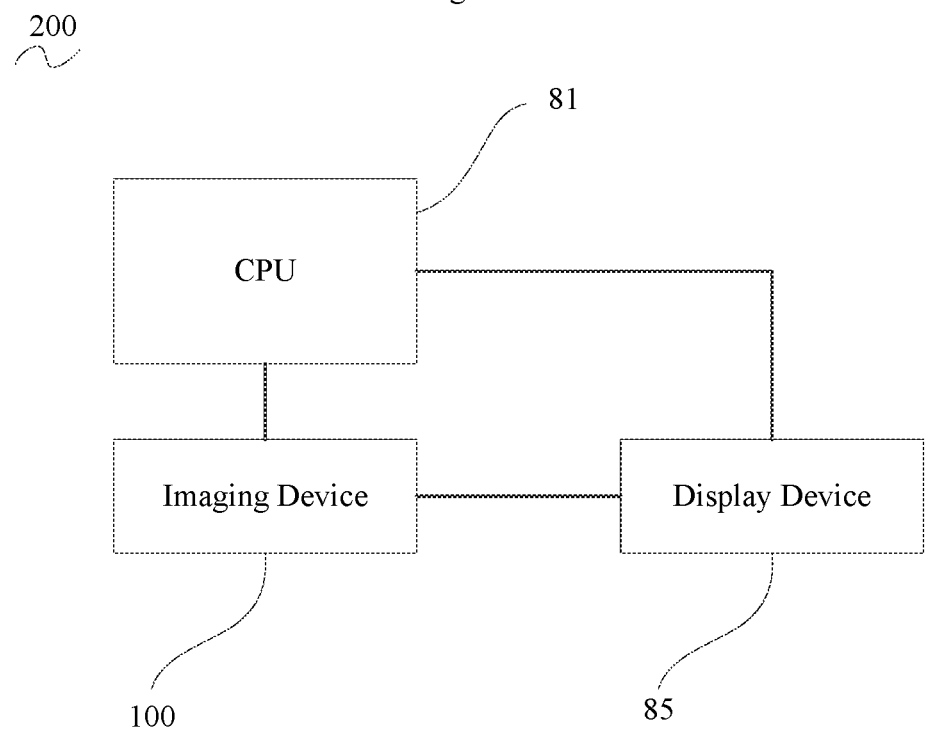
FIG. 12 is a schematic block diagram of an exemplary mobile terminal according to an embodiment of the present disclosure.

Further, as shown in FIG. 12, the mobile terminal 200 includes a display device 85, which is connected with the imaging device 100, wherein the CPU 81 is configured to control the display device 85 to display the merged images. Such that, the images taken by the mobile terminal 200 can be displayed on the display device for viewing by users. The display device may be a LED monitor.

In summary, the mobile of the present disclosure, the mobile terminal is configured to take photos and to generate a merged image with complete color, higher signal to noise ratio and higher sharpness in low light. Particularly, when the imaging device is used as the front camera, a higher brightness and sharpness and less noise self-portrait image can be generated.

An imaging method of the image sensor is further provided in the present disclosure.

Figure 13:
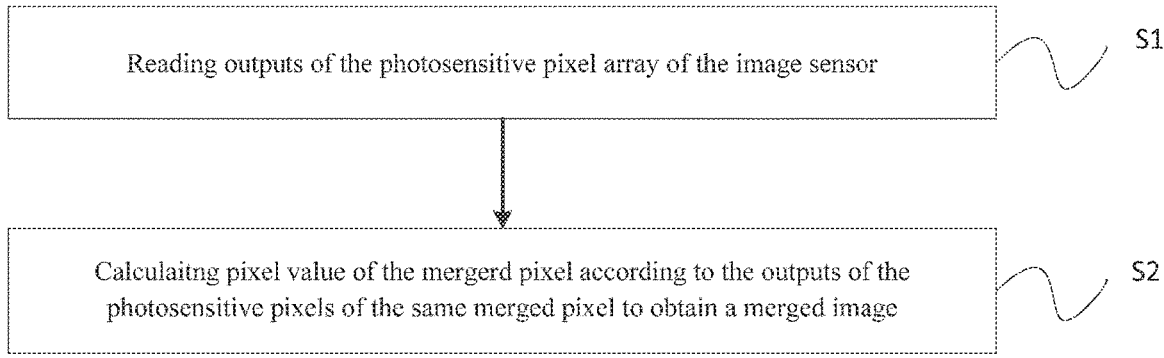
FIG. 13 is a schematic flow chart of an exemplary imaging method according to an embodiment of the present disclosure.

As shown in FIG. 13, the imaging method of the present disclosure includes:

S1: Reading outputs of the photosensitive pixel array of the image sensor.

Wherein, the image sensor includes a photosensitive pixel array and a filter arranged on the array. The filter includes a filter unit array. The filter unit array includes a plurality of filter units, wherein each unit covers N photosensitive pixels. Some of the filter units include white filter areas, wherein the whiter filter areas cover at least one of the N photosensitive pixels. A merged pixel can be formed by the N photosensitive pixels covered by the same filter unit, wherein N is positive integer. External light illuminates the photosensitive part of a photosensitive pixel to generate electric signal, which is the output of a photosensitive pixel.

Such that, embedding the white filter areas into some of the filter units, so that the brightness information of the merged pixels can be obtained in lower light, and the noise of the brightness information is less. The pixel value of a merged image generated by the merged pixels includes both color information and lower noise brightness information. Both of the brightness and the sharpness of the merged image are better and the noise of the image is less.

S2: Calculating pixel value of the merged pixel according to the outputs of the photosensitive pixels of the same merged pixel to obtain a merged image.

In detail, in some embodiments, when the filter units only include white filter area or the non-white filter area, S2 further includes: adding the outputs of the N photosensitive pixels corresponding to the same merged pixel together and making the result as the pixel value of the merged pixel.

Further, in some embodiments of the present disclosure, when the filter units include the white filter areas and the non-white filter areas, the pixel value of the merged pixel includes a first pixel value corresponding to the white filter areas and a second pixel value corresponding to the non-white filter areas. S2 further includes:

Adding the outputs of the photosensitive pixels corresponding to the white filter areas together to obtain the first pixel value of the merged pixel; and adding the outputs of the photosensitive pixels corresponding to the non-white filter areas together to obtain the second pixel value of the merged pixel.

With the sum of noise of merged pixels is less than that of photosensitive pixels before being merged, an image with higher signal to noise ratio, brightness, and sharpness, and less noise can be obtained in low light via the merged pixels.

Figure 14:
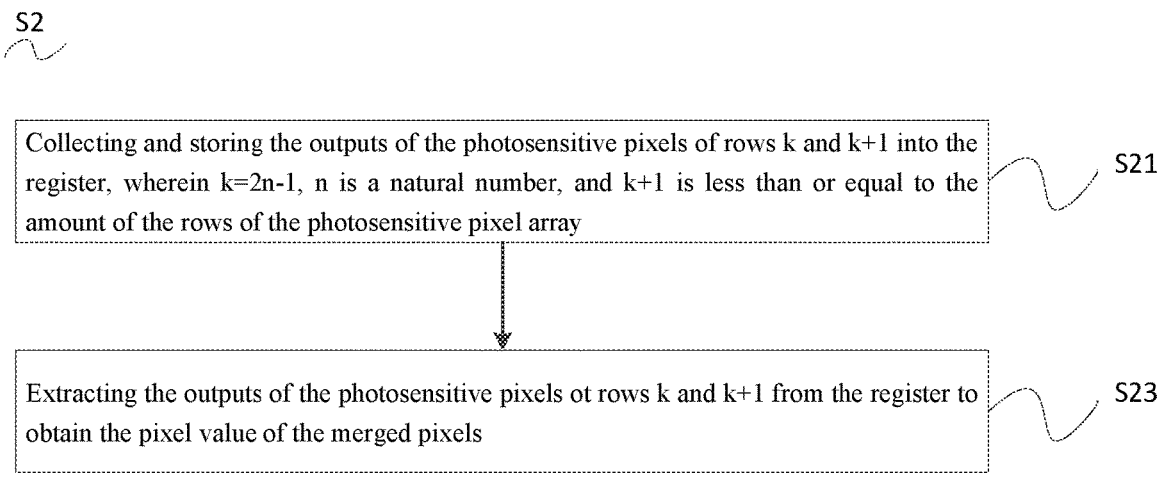
FIG. 14 is a schematic flow chart of an exemplary reading step of the imaging method according to an embodiment of the present disclosure.

Further, in an embodiment of the present disclosure, as shown in FIG. 14, S2 includes:

S21: Collecting the outputs of the photosensitive pixels of row k and row k+1, and storing them into the register, wherein k=2n−1, n is a positive integer, and k+1 is less than or equal to the amount of the rows of the photosensitive pixel array; and S22: Extracting the outputs of the photosensitive pixels of row k and row k+1 from the register to obtain the pixel value of the merged pixels.

Such that, reading outputs, buffering and merging the photosensitive units can be realized by adopting the register. Reading outputs, buffering and merging the photosensitive units can be realized easier in hardware and processed faster.

Figure 15:
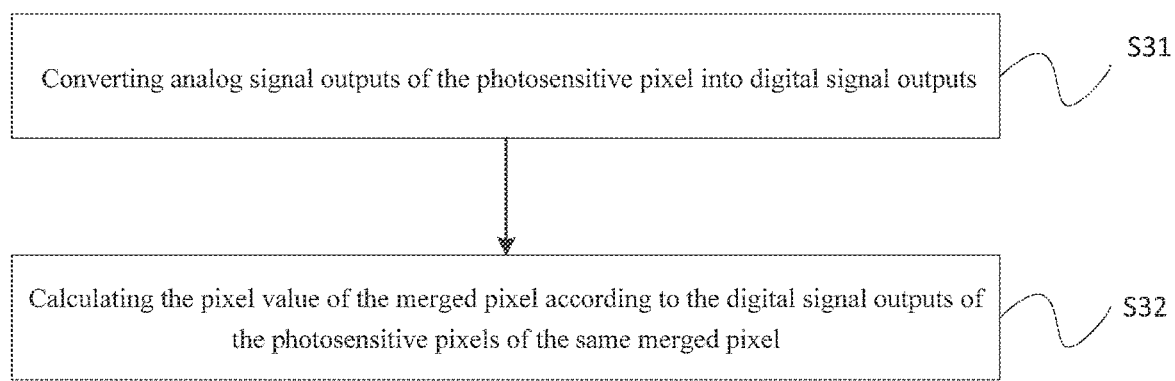
FIG. 15 is a schematic flow chart of an exemplary imaging method according to an embodiment of the present disclosure.

Further, in an embodiment of the present disclosure, as shown in FIG. 15, each ADC connects to one photosensitive pixel, the imaging method further includes:

S31: Converting analog signal outputs of the photosensitive pixel into digital signal outputs; and S32: Calculating the pixel value of the merged pixel according to the digital signal outputs of the photosensitive pixels of the same merged pixel.

Such that, firstly, the image signal process which is a digital signal process (DSP) can process the output of the image sensor directly, and secondly, the information of the image can be conserved better than the circuit processes the analog signal outputs of the image sensor. For example, in an embodiment of the present disclosure, for an image sensor with 16M pixel value, the imaging method of the present disclosure can conserve the information of 16 M pixel, and then obtain merged images with 4M pixel or other resolutions by processing the 16M pixel.

In summary, the imaging method as the present disclosure, embedding the white filter areas into some of the filter units, so that the brightness information of the merged pixels can be obtained in lower light, and the noise of the brightness information is lower. The pixel value of a merged image generated by the merged pixels includes both color information and lower noise brightness information. Both of the brightness and the sharpness of the merged image are better and the noise of the image is less. Further, Since the noise of the merged pixel is less than the sum of noise of the photosensitive pixels before being merged, the signal to noise ratio and brightness of images in low light can be improved and the noise of the image can be reduced through merging pixels by the image signal processor The unexpanded portion of the imaging method and the mobile terminal of the embodiment of the present disclosure can be referred to the corresponding portion of the image sensor or the imaging device of the mentioned above, and will not be expanded in detail here.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The logic and/or steps described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer readable medium comprise but are not limited to: an electronic connection (an electronic device) with one or more wires, a portable computer enclosure (a magnetic device), a random-access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

Those skilled in the art shall understand that all or parts of the steps in the above exemplifying method of the present disclosure may be achieved by commanding the related hardware with programs. The programs may be stored in a computer readable storage medium, and the programs comprise one or a combination of the steps in the method embodiments of the present disclosure when run on a computer.

In addition, each function cell of the embodiments of the present disclosure may be integrated in a processing module, or these cells may be separate physical existence, or two or more cells are integrated in a processing module. The integrated module may be realized in a form of hardware or in a form of software function modules. When the integrated module is realized in a form of software function module and is sold or used as a standalone product, the integrated module may be stored in a computer readable storage medium.

The storage medium mentioned above may be read-only memories, magnetic disks or CD, etc.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An imaging device, comprising:
an image sensor, wherein the image sensor comprises a photosensitive pixel array and a filter arranged on the photosensitive array, the filter comprising a filter unit array, the filter unit array comprising R filter units, G filter units, and B filter units; each filter unit covering 2*2 photosensitive pixels, and each of the G filter units comprising a white filter area and a green filter area, the white filter area covering one of four photosensitive pixels of the G filter unit and the green filter area covering the other three; or the white filter area covering three of the four photosensitive pixels of G filter unit and the green filter covering the other one; and
an image signal processor, wherein the image signal processor is configured to read and to process outputs of the photosensitive pixel array of the image sensor to obtain pixel values of merged pixels and further to obtain merged images;
wherein for each of the G filter unit, the image signal processor is further configured to add outputs of three photosensitive pixels corresponding to the white filter area together to obtain a first pixel value of the merged pixel, and to readout an output of one photosensitive pixel corresponding to the green filter area to obtain a second pixel value of the merged pixel; or readout an output of one photosensitive pixel corresponding to the white filter area to obtain a first pixel value of the merged pixel, and to add outputs of the three photosensitive pixels corresponding to the green filter area to obtain a second pixel value of the merged pixel.

2. The imaging device according to claim 1, wherein the image sensor further comprises a control module, and the control module is configured to control the photosensitive pixel array to be exposed by row.

3. The imaging device according to claim 2, wherein the image sensor further comprises a register; and the control module is configured to collect outputs of the photosensitive pixels of row k and row k+1 in turn which have been exposed and to store the outputs into the register, where k=2n−1, n is a positive integer, and k+1 is less than or equal to the amount of the rows of the photosensitive pixel array.

4. The imaging device according to claim 1, wherein the image sensor further comprises an ADC array having a plurality of ADCs; and each of the ADCs is connected to one photosensitive pixel.

5. The imaging device according to claim 1, wherein the image sensor further comprises a micro-lens array; wherein the micro-lens array comprises a plurality of micro-lens and wherein each micro-lens corresponds to one photosensitive pixel.

6. A mobile terminal, comprising: an imaging device, wherein the imaging device comprises an image sensor and an image signal processor, the image sensor comprising a photosensitive pixel array and a filter arranged on the photosensitive array, the filter comprising a filter unit array, the filter array comprising R filter units, G filter unit and B filter units, each filter unit covering 2*2 photosensitive pixels, and each of the G filter units comprising a white filter area and a green filter area, the white filter areas covering one of four photosensitive pixels of the G filter unit and the green filter area covering the other three; or the white filter area covering three of the four photosensitive pixels of G filter unit and the green filter covering the other one, the image signal processor is configured to read and to process outputs of the photosensitive pixel array of the image sensor to obtain pixel values of merged pixels and further to obtain merged images;

wherein for each of the G filter units, the image signal processor is further configured to add outputs of three photosensitive pixels corresponding to the white filter area together to obtain a first pixel value of a merged pixel, and to readout an output of one photosensitive pixel corresponding to the green filter area to obtain a second pixel value of the merged pixel, or readout an output of one photosensitive pixel corresponding to the white filter area to obtain a first pixel value of the merged pixel, and to add outputs of the three photosensitive pixels corresponding to the green filter area to obtain a second pixel value of the merged pixel.

7. The mobile terminal of claim 6, wherein the mobile terminal may be a cell phone.

8. The mobile terminal of claim 7, wherein the imaging device may be a front camera of the mobile terminal.

9. The mobile terminal of claim 6, wherein further comprising a CPU and an external memory, wherein the CPU is configured to control the external memory to store the merged images.

10. The mobile terminal of claim 9, further comprising a display device, wherein the CPU is configured to control the display device to display the merged images.

11. The mobile terminal according to claim 6, wherein the image sensor further comprises a control module, and the control module is configured to control the photosensitive pixel array to be exposed by row.

12. The mobile terminal according to claim 6, wherein the image sensor further comprises a register; and the control module is configured to collect outputs of the photosensitive pixels of row k and row k+1 in turn which have been exposed and to store the outputs into the register, where k=2n−1, n is a positive integer, and k+1 is less than or equal to the amount of the rows of the photosensitive pixel array.

13. The mobile terminal according to claim 6, wherein the image sensor further comprises an ADC array having a plurality of ADCs; and each of the ADCs is connected to one photosensitive pixel.

14. An imaging method of an image sensor, comprising:
reading outputs of a photosensitive unit array of the image sensor; the image sensor comprising a photosensitive pixel array and a filter arranged on the photosensitive array, the filter comprising a filter unit array, the filter array comprising R filter units, G filter unit and B filter units, each filter unit covering 2*2 photosensitive pixels, and each of the G filter units comprising a white filter area and a green filter area, the white filter areas covering one of four photosensitive pixels of the G filter unit and the green filter area covering the other three; or the white filter area covering three of the four photosensitive pixels of G filter unit and the green filter covering the other one,
and
calculating pixel values of merged pixels according to the outputs of the photosensitive pixels of the merged pixel in order to obtain a merged image;
wherein for each of the G filter units, the pixel values of a merged pixel comprise a first pixel value corresponding to the white filter area and a second pixel value corresponding to the green filter area, the step of calculating pixel values of merged pixels according to the outputs of the photosensitive pixels of the merged pixel in order to obtain a merged image further comprises:
adding outputs of three photosensitive pixels corresponding to the white filter area together to obtain a first pixel value of the merged pixel; and
reading out an output of one photosensitive pixel corresponding to the green white filter area together to obtain a second pixel value of the merged pixel; or
reading out an output of one photosensitive pixel corresponding to the white filter area to obtain a first pixel value of the merged pixel, and adding outputs of the three photosensitive pixels corresponding to the green filter area to obtain a second pixel value of the merged pixel.

15. The imaging method of claim 14, wherein each filter unit comprises 2*2 photosensitive pixels; wherein the step of calculating pixel values of merged pixels according to the outputs of the photosensitive pixels of the merged pixel in order to obtain a merged image further comprises:
collecting and storing the outputs of the photosensitive pixels of row k and row k+1 into the register, wherein k=2n−1, n is a positive integer, and k+1 is less than or equal to the amount of the rows of the photosensitive pixel array; and
extracting the outputs of the photosensitive pixels of row k and row k+1 from the register to obtain pixel values of merged pixels.

16. The imaging method of claim 14, wherein each ADC connects to one photosensitive pixel, the imaging method further comprises:
converting analog signal outputs of the photosensitive pixel into digital signal outputs; and
calculating the pixel value of the merged pixel according to the digital signal outputs of the photosensitive pixels of the same merged pixel.

* * * * *